US007982636B2

(12) United States Patent
Abali et al.

(10) Patent No.: US 7,982,636 B2
(45) Date of Patent: Jul. 19, 2011

(54) DATA COMPRESSION USING A NESTED HIERACHY OF FIXED PHRASE LENGTH STATIC AND DYNAMIC DICTIONARIES

(75) Inventors: Bulent Abali, Yorktown Heights, NY (US); Mohammad Banikazemi, Yorktown Heights, NY (US); Peter Franaszek, Yorktown Heights, NY (US); Luis A. Lastras, Yorktown Heights, NY (US); Dan E. Poff, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 12/544,726

(22) Filed: Aug. 20, 2009

(65) Prior Publication Data

US 2011/0043387 A1   Feb. 24, 2011

(51) Int. Cl.
    *H03M 7/30* (2006.01)
(52) U.S. Cl. .......................................... 341/51; 341/87
(58) Field of Classification Search .................... 341/51, 341/87, 106; 711/118–146
    See application file for complete search history.

(56) References Cited

U.S. PATENT DOCUMENTS

| 4,558,302 | A | * | 12/1985 | Welch | 341/51 |
| 4,876,541 | A | * | 10/1989 | Storer | 341/51 |
| 5,010,345 | A | * | 4/1991 | Nagy | 341/65 |
| 6,657,565 | B2 | * | 12/2003 | Kampf | 341/51 |
| 7,443,321 | B1 | * | 10/2008 | Kaufman et al. | 341/87 |
| RE41,152 | E | * | 2/2010 | Reynar et al. | 341/51 |
| 2003/0197630 | A1 | * | 10/2003 | Border et al. | 341/106 |
| 2006/0106870 | A1 | | 5/2006 | Franaszek et al. | |

* cited by examiner

*Primary Examiner* — Howard Williams
(74) *Attorney, Agent, or Firm* — Scully, Scott, Murphy & Presser, P.C.; Daniel P. Morris, Esq.

(57) ABSTRACT

The present invention describes lossless data compression/decompression methods and systems. A random access memory (RAM) operates as a static dictionary and includes commonly used strings/symbols/phrases/words. An input buffer operates as a dynamic dictionary and includes input strings/phrases/symbols/words. A set-associative cache memory operates as a hash table, and includes pointers pointing to the commonly used strings/symbols/phrases/words in the static dictionary and/or pointing to one or more of the input strings/phrases/symbols/words in the dynamic dictionary. Alternatively, the set-associative cache memory combines the dynamic dictionary, the static dictionary and the hash table. When encountering a symbol/phrase/string/word in the static or dynamic dictionary in an input stream, a compressor logic or module places a pointer pointing to the symbol/phrase/string/word at a current location on the output stream. The hash table may include phrases/symbols/strings/words and/or pointers pointing to phrases/symbols/strings/words.

24 Claims, 4 Drawing Sheets

DATA COMPRESSION USING A NESTED HIERACHY OF FIXED PHRASE LENGTH STATIC AND DYNAMIC DICTIONARIES

BACKGROUND

The present invention relates to data compression and data decompression. More particularly, the present invention relates to lossless data compression and decompression.

A lossless data compression/decompression refers to the use of data compression/decompression algorithms that enable original data to be reconstructed from compressed data. Lossless data compression/decompression is used in a many of applications. For example, lossless data compression/decompression is used in the popular Winzip® application and Unix® gzip (GNU zip) application. Especially, lossless data compression/decompression is used when it is important that an original data and a decompressed data be identical.

A traditional solution for the lossless data compression/decompression uses a dynamic dictionary technique. The dynamic dictionary technique refers to creating a dictionary (i.e., an object such as a list, an array, a vector storing words and/or their references) dynamically, on the fly, while examining contents of input data to be compressed. Larger input data on an average includes more repeating symbols than smaller input data, as probability of finding repeating symbols in the larger input data stream is higher than the smaller input data. Therefore, larger input data become compressed more efficiently than small input data on an average when using the dynamic dictionary based technique. However, having larger input data is a disadvantage when used in a conjunction with a cache memory, as larger data blocks impact cache performance. It has been proven that data blocks are compressed better when they are 512 bytes or larger, however a typical cache memory has a block length of 32 to 128 bytes.

Though the traditional solution performs lossless data compression/decompression well, there are ways to further improve compression efficiency and compression speed of the traditional solution. Thus, it is desirable to provide a system and method to perform lossless data compression/decompression efficiently and fast.

BRIEF SUMMARY

The present invention describes a method and a system for performing lossless data compression/decompression by combining the dynamic dictionary technique and a static dictionary technique (i.e., a technique for using a pre-loaded or pre-built dictionary including commonly used symbols/words).

In one embodiment, there is provided a method for performing data compression, the method comprising:

computing a hash value for a current input string in an input stream, the hash value being used to access to an entry in a hash table;

evaluating whether the entry in the hash table is empty;

evaluating whether the entry has a pointer pointing to a previous input string matching with the current input string, if the entry is not empty; and placing the pointer in entry on an output stream, if the entry has the pointer, wherein the output stream becomes a compressed version of the input stream by replacing the current input string with the pointer.

In one embodiment, there is provided a method for performing lossless data compression, the method comprising:

computing a hash value for a current input string in an input stream, the hash value being used to access to an entry in a hash table;

evaluating whether the entry in the hash table is empty;

evaluating whether the entry has the current input string, if the entry is not empty; and placing a pointer to the entry on an output stream, if the entry has the current input string, wherein the output stream becomes a compressed version of the input stream by replacing the current input string with the pointer.

In one embodiment, there is provided a method for performing data decompression, the method comprising:

receiving a compressed input stream including original strings, first pointers pointing to one or more of the original strings, second pointers pointing to raw strings in a static dictionary, and control bits indicating what portions of a string is compressed and what portions of the string is not compressed;

placing the original strings on an output stream at same locations where the original strings are placed on the compressed input stream;

placing the one or more of the original strings pointed by the first pointers on the output stream at same locations where the first pointers are placed on the compressed input stream; and placing the raw strings pointed by the second pointers on the output stream at same locations where the second pointers are placed on the compressed input stream, wherein the output stream becomes an uncompressed version of the compressed input stream after placing the original strings, the one or more of the original strings pointed by the first pointers and the raw strings pointed by the second pointers on the output stream.

In one embodiment, there is provided a system performing data compression, the system comprising:

a random access memory (RAM) operating as a static dictionary and including at least one commonly used string;

an input buffer operating as a dynamic dictionary and including at least one input string; and a set-associative cache memory operating as a hash table and including at least one pointer pointing to the at least one commonly used string and the at least one input string In a further embodiment, the set-associative cache memory combines the dynamic dictionary, the static dictionary and the hash table.

BRIEF DESCRIPTION OF THE SEVERAL VIEWS OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DETAILED DESCRIPTION

Dictionary based lossless compression/decompression techniques refers to a group of lossless compression/decompression techniques which use a dictionary including commonly used words/phrases/symbols/strings in order to do the compression. The dictionary may be static and defined regardless of data (e.g. stores commonly used words/phrases/symbols/strings in English language) or the dictionary can be dynamic and created based on data being compressed. A dictionary may be external if it is stored as a separate object (still can be part of a compressed file). The external dictionary may be referred as a static dictionary. So when a string in an input stream finds a match with an entry in the static/external dictionary, the string can be replaced with a reference to the entry in the static/external dictionary. When a dictionary is internal, there is no independent, "separate" object as the dictionary. Content of an input stream is a dictionary itself. For example, if the input stream includes a string "Hello!" twice, the second occurrence of this string can be replaced with a reference to the first occurrence of the string. Therefore, a part of the input data is the internal dictionary. The internal dictionary may be referred as a dynamic dictionary.

Dictionary based compression techniques remove redundancy in an input stream by replacing repeating words/strings/symbols/phrases with pointers to a previous occurrence of the repeating words/strings/symbols/phrases.

A symbol fetched from an input stream is searched for a matching symbol in the dynamic dictionary and the static dictionary. If the matching symbol is found, the symbol is replaced in an output stream with a pointer pointing to a location of the matching symbol in the input stream or with a pointer pointing to the matching string in the static dictionary. Thus, instead of the repeating symbol (i.e., a symbol which finds a matching string in the dictionary(s)), the pointer pointing to the matching string is outputted to the output stream. Pointers generally consume less storage/space than symbols do, hence the output stream can be shorter than the input stream. Hence, the output stream may be a compressed version of the input stream.

Static dictionary techniques, as compared to the dynamic dictionary techniques, use a pre-built and pre-loaded dictionary including commonly used or known symbols/phrases/strings/words. For example, it has been observed that a binary symbol zero '0' represented in 8, 16, 32 and 64 bit formats is found more often than any other symbol in a computer memory and storage device (e.g., a disk). Thus, a static dictionary may be pre-loaded with well known symbols such as the binary symbol '0' representations in an anticipation of seeing those symbols in a future across all data blocks in the memory or storage device. In this technique, it is not necessary to look for repeating symbols in an input stream. Even if the symbol appears only once in the input stream, the symbol can be replaced by a pointer (i.e., a pointer pointing to a string in a static dictionary), since the static dictionary is readily available before processing (compressing) the input stream.

Figure 2:
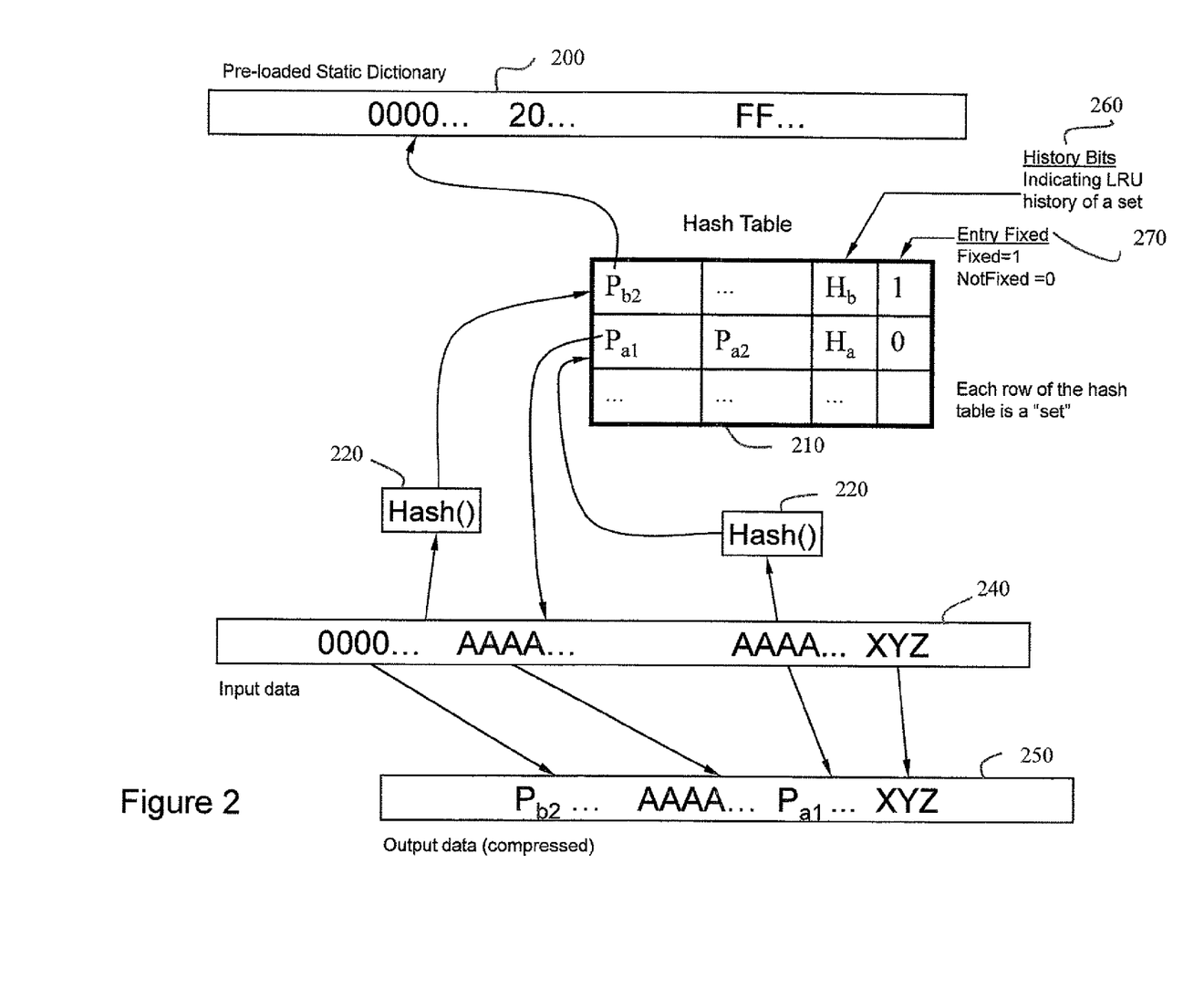
FIG. 2 illustrates a system diagram according to one embodiment of the present invention.

In one embodiment, the dynamic dictionary technique and the static dictionary technique are combined, e.g., by using a hash table (e.g., a hash table 210 in FIG. 2). The combining the dynamic dictionary technique with the static dictionary technique improves compression efficiency, e.g., replacing more strings/symbols/words with pointers pointing to strings/symbols/words in a dictionary. According to one embodiment, by implementing the dynamic dictionary, the static dictionary and the hash table in hardware, the present invention obtains a fast compression/decompression speed.

In one embodiment, there is a hash table used for a quick lookup of repeated symbols/phrases/words/strings in an input stream. In a further embodiment, the hash table and dictionaries (static dictionary and dynamic dictionary) are combined to improve compression speed. In a further embodiment, the hash table is implemented on a set-associative cache memory. Thus, a phrase/word/symbol/string can be found in one of multiple locations in the hash table. Furthermore, the set-associative implementation of the hash table reduces hash collisions, reduces a phrase/word/symbol/string eviction from the hash table, and improves compression efficiency by retaining more frequently used phrases/words/symbols/strings in the hash table.

Figure 1:
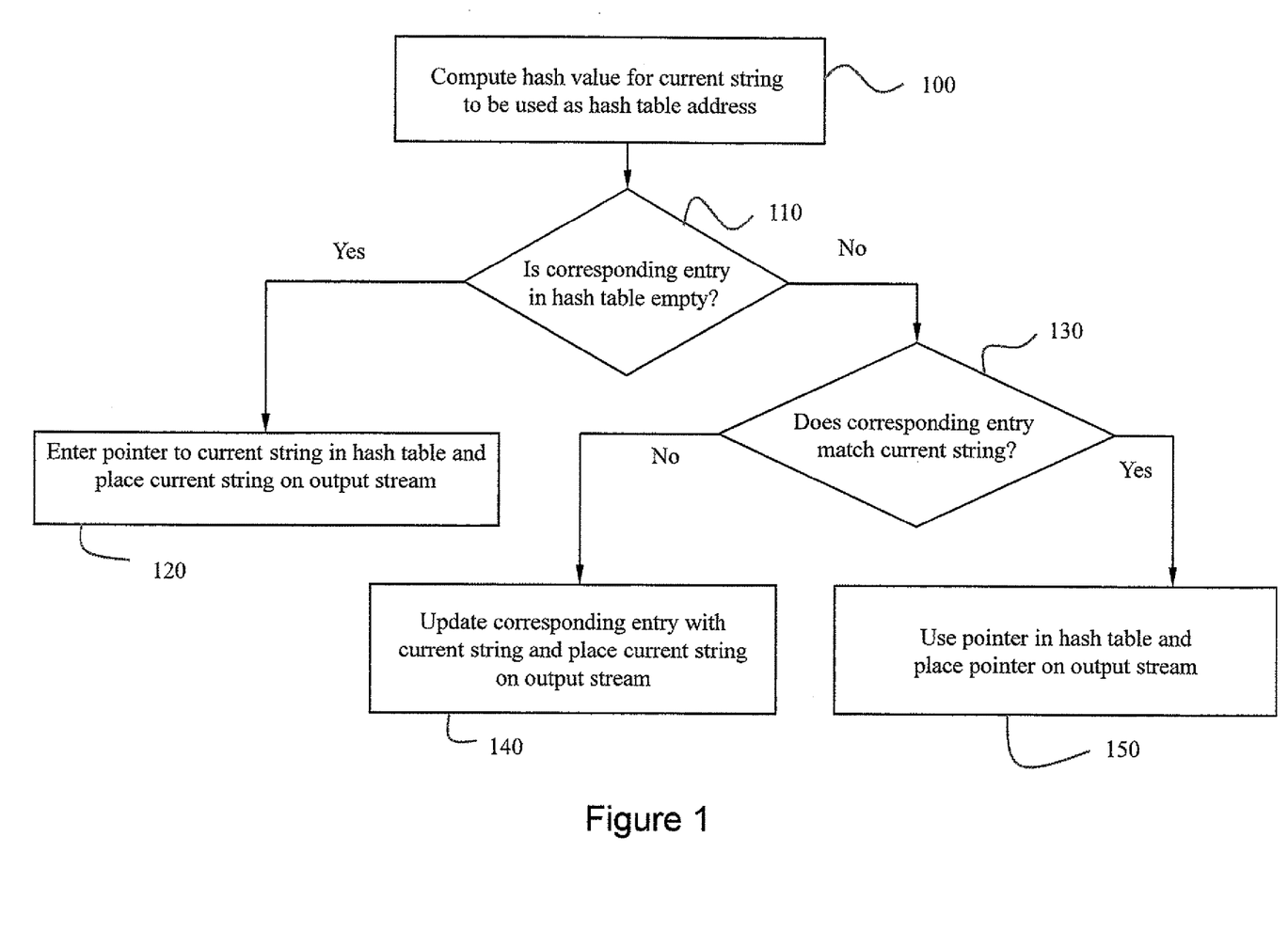
FIG. 1 illustrates a flow chart describing method steps for performing lossless data compression according to one embodiment of the present invention.

FIG. 1 illustrates a flow chart describing method steps for performing lossless data compression. A general purpose processor (e.g., IBM® PowerPC®, Intel® Core®) receives an input stream (i.e., data stream including input strings to be compressed), e.g., via an input/output device (e.g., a keyboard, a network device, a communications bus). At step 100, the processor computes a hash value for a current input string (i.e., an input string being evaluated by the processor) in the input stream, e.g., based on a hash function (e.g., a hash function 220 in FIG. 2). The processor may use the hash value to access an entry in a hash table (e.g., a hash table 210 in FIG. 2). For example, the hash value may represent an address of a hash table entry.

At step 110, the processor evaluates whether the entry in the hash table being accessed with the hash value (hereinafter "hash table entry") is empty or not. If the hash table entry is empty, at step 120, the processor enters a pointer pointing to the current input string into the hash table entry and places the current input string on an output stream (i.e., a data stream to include compressed version of the input stream). Otherwise, at step 130, the processor evaluates whether the hash table entry includes a pointer pointing to a previous input string matching with the current string. The processor may further evaluate whether the hash table entry includes a pointer pointing to an entry in a static dictionary (hereinafter "static dictionary entry"), which includes the current input string.

At step 140, if the hash table entry neither includes the pointer pointing to the static dictionary entry nor includes the pointer pointing to the previous input string, the processor updates the hash table entry, e.g., by entering the pointer pointing to the current input string into the hash table entry, and places the current input string on the output stream. Otherwise, at step 150, the processor places the pointer pointing to the previous input string in the hash table entry on the output stream, if the hash table entry includes the pointer pointing to the previous input string. The processor may place the pointer pointing to the static dictionary entry on the output stream, if the hash table entry includes the pointer to pointing to the static dictionary entry. Thus, the processor places the pointer pointing to the previous input string at a location of the current input string in the output stream or places the pointer pointing to the static dictionary entry at a location of the current input string in the output stream. In other words, the processor replaces the current input string with the pointer pointing to the previous input string or the pointer pointing to the static dictionary entry. Then, the output stream becomes a compressed version of the input stream by the replacement, e.g., because pointers generally require less space/storage than strings.

FIG. 2 illustrates a system diagram implementing the method steps described in FIG. 1. In FIG. 2, a static dictionary 200 implemented in a random access memory (RAM) is pre-loaded with at least one commonly used symbols/ phrases/strings/words found in a memory or storage device (e.g., disk). For example, symbols/phrases/strings/words 0000, 20, and FF represented in a hexadecimal format are preloaded in to the static dictionary 200. The commonly used symbols/phrases/strings/words may be found a novel, textbook or story book. For example, an elementary school English textbook may include commonly used English symbols/phrases/strings/words. All words in an English dictionary may be loaded in the static dictionary 200. Other examples of commonly used strings include instructions that a microprocessor executes in a program, and headers of data structures that might be very frequent in a memory address space.

In one embodiment, a hash table 210 implemented on a RAM maps input phrases/strings/symbols/words to pointers pointing to phrases/strings/symbols/words in dynamic and static dictionaries. A dynamic dictionary 240 implemented on an input buffer or memory stores at least one input phrase/string/symbol/word. The hash table 210 comprises rows. A hash function implemented in hardware, illustrated as Hash( ) 220 in FIG. 2 maps each input phrase/string/symbol/word to a row in the hash table 210. Each row comprises pointers. Depending on an implementation, there may be 1, 2, 4 or more pointers in each row in the hash table 210. In one embodiment, the hash table 210 is implemented on a set-associative cache memory includes at least one pointer pointing to the least one commonly used string/phrase/symbol/word in the static dictionary 200 and pointing to the at least one input phrase/string/symbol/word in the dynamic dictionary 240. If only one pointer exists per row, then the hash table 210 becomes a direct-mapped cache memory. If two pointers exist in two entries in a row, then the hash table becomes a 2-way set associative cache memory.

In a further embodiment, a compressor logic (i.e., a logic executing the method steps described in FIG. 1) uses the hash table 210 to map an input phrase/symbol/string/word in the input stream to the at least one commonly used phase/string/symbol/word in the static dictionary 200 or to the at least one input phrase/string/symbol/word in the dynamic dictionary 240. In other words, the compressor logic uses the hash table 210 to map a new input phrase/symbol/string (i.e., an input phase/string/symbol/word that has not been evaluated by the processor) in an input buffer 240 to the at least one commonly used phase/string/symbol/word in the static dictionary 200 or to the at least one input phase/string/symbol/word in the dynamic dictionary 240.

In a further embodiment, the hash function 220 evenly maps the at least one input phrase/symbol/string/word in the dynamic dictionary 240 to entries in the hash table 210. The hash function 220 also evenly maps the at least one commonly used phase/string/symbol/word in the static dictionary 200 to entries in the hash table 210.

The dynamic dictionary 240 in FIG. 2 works as following: when the compressor logic encounters an input phrase in an input stream 240, for example AAAA in FIG. 2, for the first time, a row in the hash table 210 that the input phrase maps to is updated with a pointer to that phrase in the input stream 240. In one embodiment, the hash table 210 is a reminder of locations of phrases that the compressor logic has encountered before. When the compressor logic encounters a new input phrase during scanning of the input stream 240, for example a repeated phrase AAAA in FIG. 2, the compressor logic maps the new input phrase to a row in the hash table 210 and compares that new input phrase to previous input phrases pointed by pointers in that row in the hash table 210. If one of comparisons matches (i.e., there is a previous input phrase matching with the new input phrase; there is an entry in the row in the hash table 210 that includes a pointer pointing to a previous input phrase matching with the new input phrase), then the compressor logic outputs the pointer in the entry in the row in the hash table 210 on an output stream 250 as illustrated by a pointer Pa1 in FIG. 2. If the comparisons do not find a match (i.e., previous input phrases do not match with the new input phrase), then the compressor logic copies the new input phrase on the output stream 250 as illustrated by a string XYZ on the output stream 250 in FIG. 2. In one embodiment, a pointer placed on the output stream 250 may be an absolute pointer pointing to a location of an original phrase in the output stream 250. In another embodiment, the pointer may be a relative pointer describing how far back the original phrase is from a current location in the output stream 250.

The static dictionary 200 is similar to the dynamic dictionary 240. However, pointers in the hash table 210 point to strings/phrases/words/symbols in the static dictionary (RAM) 200 and not the dynamic dictionary (input buffer) 240. As stated above, the static dictionary 200 is preloaded before starting compression/decompression and can be readily accessed by the compressor logic without having to find repeated phrases/strings/symbols/words in the input buffer 240. For example, the static dictionary 200 is preloaded with phrases including 0000, 20, and FF and hash table entries that those preloaded phrases map to is initialized with pointers, e.g., Pb2 pointing to 0000.

The hash function 220 can potentially map multiple phrases to a same row of the hash table 210. In the dynamic dictionary technique, phrases mapping to a same row may evict each other. In other words, most recently encountered phrase may cause an older phrase to be forgotten/evicted/replaced. In the static dictionary technique, it may be desirable that static dictionary entries not be forgotten/evicted/replaced. Therefore, a last column of each row in the hash table 210 includes a bit called "Fixed" 270. Setting the Fixed bit to a predetermined value, e.g., a logic 1, locks pointers in the row. In other words, the pointers in a row where a Fixed bit 270 is set to 1 cannot be forgotten/evicted/replaced. No phrase in the input stream 240 can replace pointers in the row where a corresponding Fixed bit 270 is set to 1. Thus, when the Fixed bit 270 is set to 1 in a row, pointers in the row point to phrases/strings/symbols/words in the static dictionary 200 and those pointers cannot be forgotten/evicted/replaced. When the Fixed bit 270 is set to 0 in a row, pointers in the row points to previous input phrase/string/symbol/words in the dynamic dictionary (the input buffer) 240 and those pointers can be forgotten/evicted/replaced. The fixed bit may be added on a per entry of the row basis, so as to improve the granularity of what is fixed and what is not fixed. It is important to note that it is not made a requirement in this invention for there to be a fixed bit to protect entries pointing to a static dictionary, since the encoder and the decoder are design to maintain synchrony and if a static dictionary entry is no longer accessible due to the lack of a pointer in the hash table, then this will be experienced by both the encoder and decoder when operating at the corresponding stage of the compression/decompression steps.

The hash table 210 includes a column storing History bits 260 used with a (cache) replacement algorithm. A replacement algorithm refers to a selection of a pointer to be evicted from the hash table 210. In hash table 210 implemented on an N-way set associative cache memory, a pointer can be mapped to one of N possible locations (ways) in a row it maps to. When a new pointer evicts an old pointer, the old pointer is forgotten and replaced by the new pointer. Thus, it is desirable to store repeatedly accessed pointers and throw away less or never accessed pointers from the hash table 210 to obtain a higher compression rate. In one embodiment of the present invention, the compressor logic selects a replacement algorithm called "Least Recently Used" (LRU). When LRU algorithm is applied to the hash table 210, a new pointer will evict the least recently used pointer in a row that the new pointer maps to in the hash table 210. In another embodiment, the compressor logic may select other replacement algorithms including, but not limited to, first in first out (FIFO), least frequently used (LFU) and random replacement algorithm. When FIFO algorithm is applied to the hash table 210, a new pointer will evict the oldest pointer in a row that the new pointer maps to in the hash table 210. When LFU algorithm is applied, a new pointer will evict the least frequently used pointer in a row that the new pointer maps to in the hash table 210. When the random replacement algorithm is applied, a new pointer will evict any pointer in a row that the new pointer maps to in the hash table 210. The history bit 260 may indicate a location of a pointer to be replaced/evicted/forgotten by a new pointer.

In a further embodiment, the hash table 210 may include pointers pointing to strings/symbols/phrases/words in the dynamic dictionary 240 and pointers pointing to strings/symbols/phrases/words in the static dictionary 200 in a same row. Therefore, there may be a Fixed bit 270 per each pointer.

Figure 3:
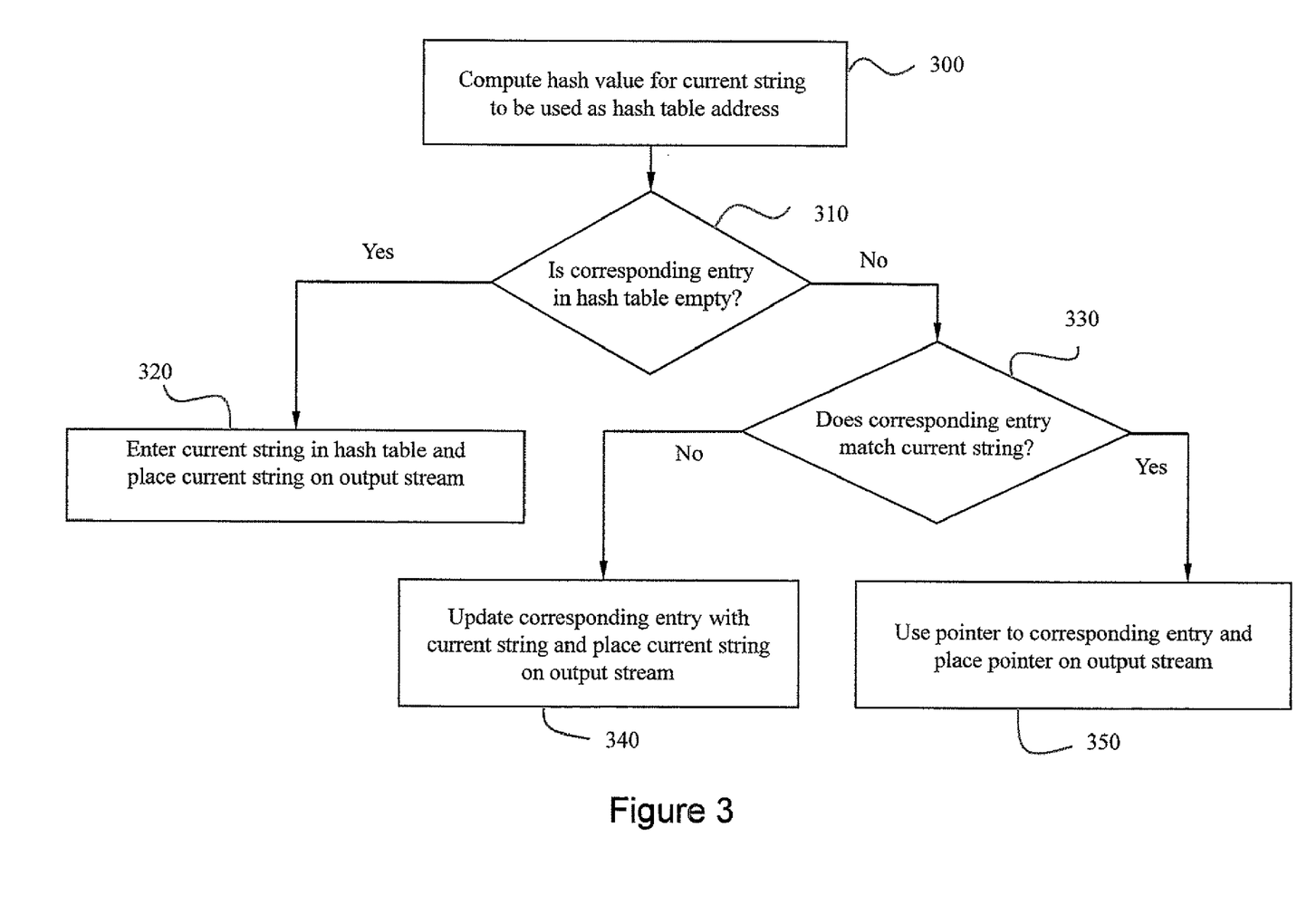
FIG. 3 illustrates a flow chart describing method steps for performing lossless data compression according to one embodiment of the present invention.

FIG. 3 illustrates a flow chart describing method steps for performing lossless data compression. A general purpose processor receives an input stream, e.g., via an input/output device. At step 300, the processor computes a hash value for a current input string in the input stream, e.g., based on a hash function (e.g., a hash function 330 in FIG. 4). The processor may use the hash value to access an entry in a hash table (e.g., a hash table 320 in FIG. 4). For example, the hash value may represent an address of a hash table entry.

At step 310, the processor evaluates whether the entry in the hash table being accessed with the hash value (hereinafter "hash table entry") is empty or not. If the hash table entry is empty, at step 320, the processor enters the current input string into the hash table entry and places the current input string on an output stream. Otherwise, at step 330, the processor evaluates whether the hash table entry includes the current string.

At step 340, if the hash table entry does not include the current input string, the processor updates the hash table entry, e.g., by entering the current input string into the hash table entry, and places the current input string on the output stream. Otherwise, at step 350, the processor places a pointer pointing to the hash table entry on the output stream. Thus, the processor places the pointer pointing to the hash table entry at a location of the current input string in the output stream. In other words, the processor replaces the current input string with the pointer pointing to hash table entry. Then, the output stream becomes a compressed version of the input stream by the replacement, e.g., because pointers require less space/storage than strings.

Figure 4:
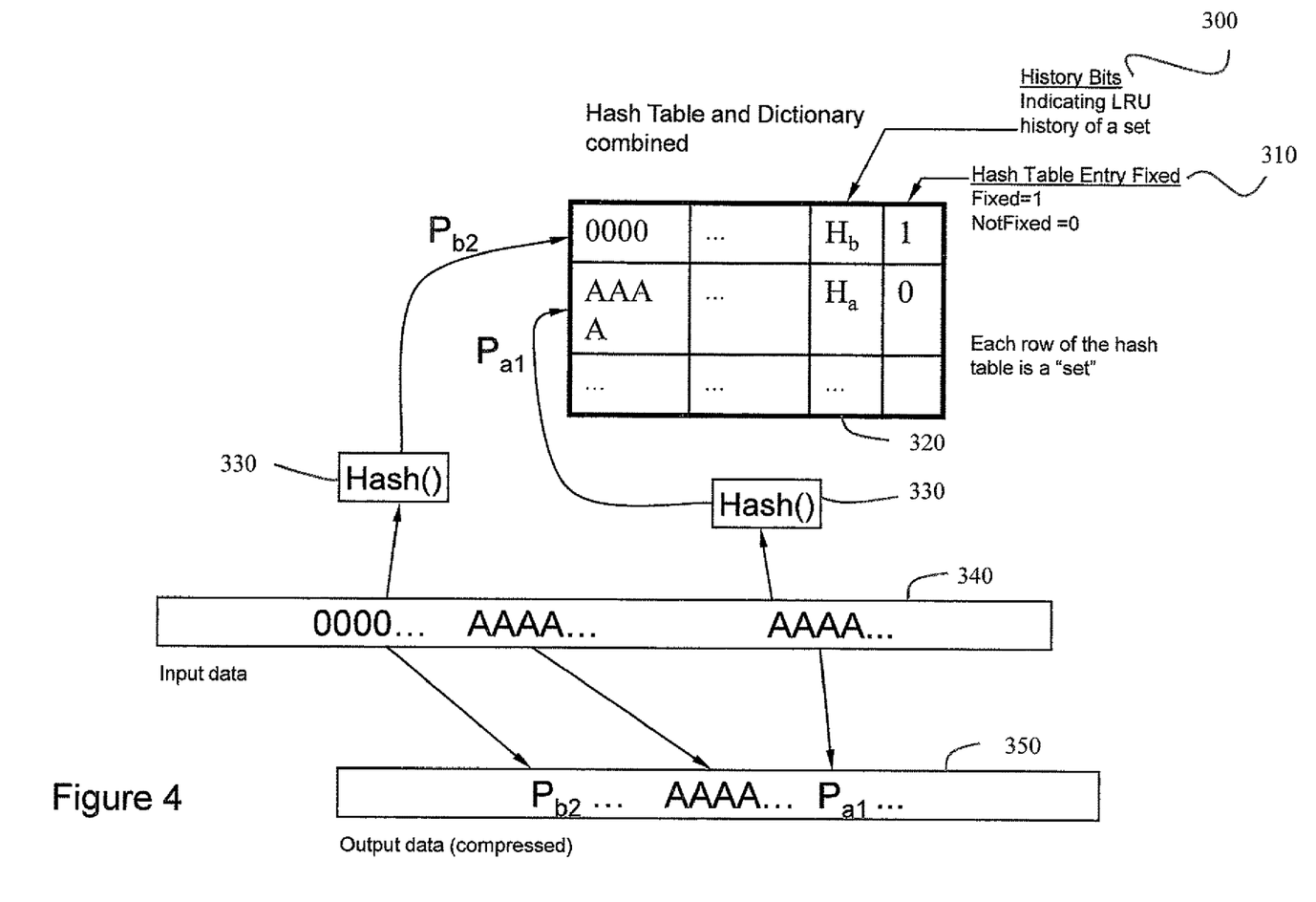
FIG. 4 illustrates a system diagram according to one embodiment of the present invention.

FIG. 4 illustrates a system diagram implementing the method steps described in FIG. 3. In FIG. 4, the hash table and the dictionaries, both static and dynamic, are combined in a RAM or a set-associative cache memory. In other words, the hash table 210, the dynamic dictionary 240 and the static dictionary 200 are combined in a hash table 320 implemented on a set-associative cache memory. An entry in the hash table 320 stores a phrase/symbol/string/word instead of a pointer to the phrase/symbol/string/word. When a repeated phrase/symbol/string/word exists in an input stream 340, for example a second string of AAAA in FIG. 4, the repeated phrase/symbol/string/word is mapped to a row of the hash table, e.g., via a hash function 330, and compared to phrases/symbols/strings/words already stored in that row in the hash table 320 (hereinafter "hash table row"). If the stored phrase/symbol/string/word in the hash table row and an input phrase/symbol/string/word in the input stream 340 match each other, then a compressor module (i.e., a module executing the method steps described in FIG. 3) outputs an index of the hash table row (i.e., a pointer to the hash table row), e.g., Pa1 in FIG. 4, and the location of the stored phrase/symbol/string/word in the hash table row on the output stream 350. If the stored phrase/string/symbol/word in the hash table row and the input phrase/string/symbol/word in the input stream 340 do not match, then the compressor module place the input phrase/string/symbol/word on the output stream 350 and enters the input phrase/string/symbol/word in an entry in the hash table row, e.g., via a pointer created by the hash function 330 to index the hash table row and/or via a history bit 300 indicating which entry in the hash table row needs to be replaced/evicted/forgotten. The system illustrated in FIG. 4 has a speed advantage over the system illustrated in FIG. 3, because an indirect lookup of phrases/symbols/strings/words via pointers is eliminated. However, the system illustrated in FIG. 4 may need more RAM or cache memory as phrases/strings/symbols/words need more storage/space than pointers.

In a further embodiment, the hash table 320 includes history bits 300 used with replacement algorithms. According to a replacement algorithm used, the history bits 300 may indicate a hash table entry including a stored phrase/symbol/string/word to be replaced with a new input phrase/string/symbol/word.

In a further embodiment, the hash table 320 includes a Fixed bit 310 per a row. If a Fixed bit 310 is set to 1 in a row in the hash table 320, stored phrases/strings/symbols/words in that row are from a static dictionary and are not replaced/evicted/forgotten. If Fixed bit 310 is set to 0 in a row in the hash table 320, stored phrases/strings/symbols/words in that row are from a dynamic dictionary and can be replaced/evicted/forgotten. In another embodiment, the hash table includes a Fixed bit 310 every stored phrase/string/symbol/word. If the Fixed bit 310 is set to 1, then a corresponding phrase/string/symbol/word cannot be replaced/evicted/forgotten. Otherwise, the corresponding phrase/string/symbol/word can be replaced/evicted/forgotten.

In one embodiment, decompression takes place by repeating method steps in FIGS. 1 and 3 in a reverse order. A decompression component (i.e., a component executing method steps in FIGS. 1 and/or 3 in a reverse order) receives a compressed input stream, e.g., from a computer via a network. The compressed input stream typically comprises original strings, first pointers pointing to one or more of the original strings, second pointers pointing to raw strings in a static dictionary, and control bits indicating what portion of a string is compressed and what portions of the string is not compressed. Here, the original strings and raw strings refer to uncompressed strings. The decompression component places the original strings at a current location on an output stream. In other words, the decompression component copies the original strings from the compressed input stream to place the original strings at same relative positions where the original strings are placed on the compressed input stream. For example, if an original string "AAAA" is placed at the fourth position in a compressed input stream, e.g., right after two original strings and a pointer, the original string "AAAA" is placed at the fourth position in an output stream right after two original strings and a string pointed by the pointer. The decompression component places the one or more of the original strings pointed by the first pointers on the output stream at same relative positions where the first pointers are placed on the compressed input stream. For example, if a pointer placed at the third position, e.g., right after two original strings, points to the first original string in the compressed input string, the decompression component places the first original string at the third position right after the two original strings in the output stream. The decompression component places raw strings pointed by the second pointers on the output stream at same relative positions where the second pointers are placed on the compressed input stream. For example, if a pointer placed at a fifth position in the compressed input stream, e.g., right after four original strings, points to a raw string in a static dictionary, the decompression component places the raw string at the fifth position right after placing the four original strings in the output stream. Thus, the output stream becomes an uncompressed version of the compressed input stream after placing the original strings, the one or more of the original strings and the raw strings on the output stream. In other words, the output stream reconstruct original data of the compressed input stream after placing the original strings, the one or more of the original strings and the raw strings on the output stream.

According to one embodiment based on FIG. 2, the decompression component copies original phrases from a compressed input stream to an output stream as they are. When the decompression component encounters a pointer in the compressed input stream, the pointer points back to one of the original phrases earlier decompressed and the pointed original phrase is copied from the compressed input stream to a current location in the output stream, therefore reconstructing original data. If a pointer points to a raw phrase in a static dictionary, then the decompression component copies the raw phrase pointed by the pointer from the static dictionary to the output stream.

According to one embodiment based on FIG. 4, the decompression component copies original phrases from a compressed input stream to an output stream as they are. When the decompression component encounters a pointer in the compressed input stream, the decompression component retrieves a corresponding raw phrase from the hash table 320 and places the corresponding raw phrase at a current location in the output stream. The decompression component may be able to retrieve the corresponding raw phrase from the hash table 320, e.g., by using the pointer as an index of the hash table row. The compressed input stream may also include information a location of the corresponding raw phrase in the hash table row.

In one exemplary embodiment, the compression logic or the compression module divides an uncompressed input stream in 8 byte chunks, which is a common size found in computer system memories. To increase a compression speed, the compression logic or the compression module hierarchically divides and processes each 8 byte chunk as one 8 byte unit, two 4 byte units, and four 2-byte units. There may be three separate hash tables, i.e., one hash table per each unit size of 2, 4, 8 bytes. Each hash table may be implemented on a multi-ported RAM, e.g., Maxim DS1609. Thus the logic or module performs the 7 hash table comparisons (1×8 byte comparison, 2×4 byte comparison, 4×2 byte comparison=7 comparisons total) in parallel for improving speed. In a further exemplary embodiment, there is a static dictionary for each of the three hash table. Each hash table is implemented on a set-associative cache memory. The hash table may include phrases/symbols/strings/words and/or pointers to phrases/symbols/strings//words.

Loading and using the static dictionary comprises the following steps and procedures. (a) a dictionary may be loaded with phrases/symbols/strings/words using software instructions, e.g., an assembly language "ld" (load). Since static dictionaries are expected to be small, phrases/strings/symbols//words may be loaded one at a time, (b) a start instruction/signal allows the compressor logic or module to start using the static dictionary, finally (c) a stop instruction/signal prevents the compressor logic or module from using the static dictionary.

In one embodiment, the compressor logic, the compressor module and the decompression component are implemented as hardware on a reconfigurable hardware, e.g., FPGA (Field Programmable Gate Array) or CPLD (Complex Programmable Logic Device), using a hardware description language (Verilog, VHDL, Handel-C, or System C). In another embodiment, the compressor logic, the compressor module and the decompression component are implemented on a semiconductor chip, e.g., ASIC (Application-Specific Integrated Circuit), using a semi custom design methodology, i.e., designing a chip using standard cells and a hardware description language.

Although the embodiments of the present invention have been described in detail, it should be understood that various changes and substitutions can be made therein without departing from spirit and scope of the inventions as defined by the appended claims. Variations described for the present invention can be realized in any combination desirable for each particular application. Thus particular limitations, and/or embodiment enhancements described herein, which may have particular advantages to a particular application need not be used for all applications. Also, not all limitations need be implemented in methods, systems and/or apparatus including one or more concepts of the present invention.

The present invention can be realized in hardware, software, or a combination of hardware and software. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context include any expression, in any language, code or notation, of a set of instructions intended to cause a system having an information processing capability to perform a particular function either directly or after conversion to another language, code or notation, and/or reproduction in a different material form.

Thus the invention includes an article of manufacture which comprises a computer usable medium having computer readable program code means embodied therein for causing a function described above. The computer readable program code means in the article of manufacture comprises computer readable program code means for causing a computer to effect the steps of a method of this invention. Similarly, the present invention may be implemented as a computer program product comprising a computer usable medium having computer readable program code means embodied therein for causing a function described above. The computer readable program code means in the computer program product comprising computer readable program code means for causing a computer to effect one or more functions of this invention. Furthermore, the present invention may be implemented as a program storage device readable by machine, tangibly embodying a program of instructions executable by the machine to perform method steps for causing one or more functions of this invention.

The present invention may be implemented as a computer readable medium (e.g., a compact disc, a magnetic disk, a hard disk, an optical disk, solid state drive, digital versatile disc) embodying program computer instructions (e.g., C, C++, Java, Assembly languages, .Net, Binary code) executed by a processor (e.g., Intel® Core™ 2, IBM® PowerPC®) for causing a computer to perform method steps of this invention. The present invention may include a method of deploying a computer program product including a program of instructions in a computer readable medium for one or more functions of this invention, wherein, when the program of instructions is executed by a processor, the compute program product performs the one or more of functions of this invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

What is claimed is:

1. A system performing data compression, the system comprising:
    a random access memory (RAM) operating as a static dictionary and including at least one commonly used string;
    an input buffer operating as a dynamic dictionary and including at least one input string; and
    a set-associative cache memory operating as a hash table and including at least one pointer pointing to the at least one commonly used string in the static dictionary and pointing to the at least one input string in the dynamic dictionary.

2. The system according to claim 1, wherein the hash table includes a fixed bit, when the fixed bit is set to a predetermined value, a corresponding pointer points to a string in the static dictionary and the corresponding pointer cannot be replaced.

3. The system according to claim 2, wherein the hash table is used for mapping a new input string to the at least one commonly used string in the static dictionary or to the at least one input string in the dynamic dictionary.

4. The system according to claim 2, wherein the hash table uses a hash function evenly mapping the at least one input string to entries in the hash table.

5. The system according to claim 2, wherein the set-associative cache memory has the fixed bit per each row.

6. The system according to claim 2, wherein the set-associative cache memory has the fixed bit per each string.

7. The system according to claim 1, where in each entry in the hash table includes a fixed bit, when the fixed bit is set to a predetermined value, a corresponding pointer points to a string in the static dictionary and the corresponding pointer cannot be replaced.

8. The system according to claim 1, wherein the hash table comprises a history bit used with a replacement algorithm, the history bit indicating a location of a pointer to be replaced.

9. The system according to claim 8, wherein the replacement algorithm is one or more of: Least Recently Used (LRU), Least Frequently Used (LFU), First In First Out (FIFO) and random replacement algorithm.

10. The system according to claim 1, wherein the set-associative cache memory combines the dynamic dictionary, the static dictionary and the hash table.

11. The system according to claim 10, wherein the set-associative cache memory stores the at least one commonly used string and the at least one input string.

12. A method for performing data compression, the method comprising:
    computing a hash value for a current input string in an input stream, the hash value being used to access to an entry in a hash table, the hash table being a set-associative cache memory;
    evaluating whether the hash table entry is empty;
    evaluating whether the hash table entry includes a pointer pointing to a previous input string matching with the current input string, if the hash table entry is not empty;
    evaluating whether the hash table entry includes a pointer pointing to an entry in a static dictionary including the current input string, if the hash table entry is not empty; and
    placing the pointer pointing to the previous input string in hash table entry on an output stream, if the hash table entry includes the pointer pointing to the previous input string;
    placing the pointer pointing to the static dictionary entry on the output stream, if the hash table entry includes the pointer pointing to the static dictionary entry,
    wherein the output stream becomes a compressed version of the input stream by placing the pointer pointing to the previous input string or the pointer pointing to the static dictionary entry at a location of the current input string in the output stream.

13. The method according to claim 12, further comprising:
    entering a pointer pointing to the current input string in the hash table entry and placing the current input string on the output stream, if the hash table entry is empty.

14. The method according to claim 12, further comprising:
    updating the hash table entry with a pointer pointing to the current input string and placing the current input string on the output stream, if the hash table entry neither includes the pointer pointing to the previous input string matching with the current input string nor includes the pointer pointing to the static dictionary entry.

15. A computer readable medium embodying computer program instructions being executed by a processor for causing a computer to perform method steps for performing data compression, said method steps comprising the steps of claim 12.

16. A method of deploying a computer program product including programs of instructions in a computer readable medium for performing data compression, wherein, when the programs of instructions are executed by at least one processor, the computer program product performs the steps of claim 12.

17. A method for performing lossless data compression, the method comprising:
    computing a hash value for a current input string in an input stream, the hash value being used to access to an entry in a hash table, the hash table being a set-associative cache memory;

evaluating whether the entry in the hash table is empty;
evaluating whether the entry has the current input string, if the entry is not empty; and
placing a pointer to the entry on an output stream, if the entry has the current input string,
wherein the output stream becomes a compressed version of the input stream by placing the pointer at a location of the current input string in the output stream.

18. The method according to claim 17, further comprising:
entering the current input string in the entry in the hash table and placing the current input string on the output stream, if the entry is empty.

19. The method according to claim 17, further comprising:
updating the entry with the current input string and placing the current input string on the output stream, if the entry does not have the current input string.

20. A computer readable medium embodying computer program instructions being executed by a processor for causing a computer to perform method steps for performing lossless data compression, said method steps comprising the steps of claim 17.

21. A method of deploying a computer program product including programs of instructions in a computer readable medium for performing lossless data compression, wherein, when the programs of instructions are executed by at least one processor, the computer program product performs the steps of claim 17.

22. A method for performing data decompression, the method comprising:
receiving a compressed input stream including original strings, first pointers pointing to one or more of the original strings, second pointers pointing to raw strings in a static dictionary, and control bits indicating what portions of a string is compressed and what portions of the string is not compressed, the first pointers and the second pointers being stored in a hash table, the hash table being a set-associative cache memory;
placing the original strings on an output stream at same relative positions where the original strings are placed on the compressed input stream;
placing the one or more of the original strings pointed by the first pointers on the output stream at same relative positions where the first pointers are placed on the compressed input stream; and
placing the raw strings pointed by the second pointers on the output stream at same relative positions where the second pointers are placed on the compressed input stream,
wherein the output stream becomes an uncompressed version of the compressed input stream after placing the original strings, the one or more of the original strings pointed by the first pointers and the raw strings pointed by the second pointers on the output stream.

23. A computer readable medium embodying computer program instructions being executed by a processor for causing a computer to perform method steps for performing data decompression, said method steps comprising the steps of claim 22.

24. A method of deploying a computer program product including programs of instructions in a computer readable medium for performing data decompression, wherein, when the programs of instructions are executed by at least one processor, the computer program product performs the steps of claim 22.

* * * * *